US00RE44029E

(19) United States
(12) Reissued Patent
Matsuno

(10) Patent Number: US RE44,029 E
(45) **Date of Reissued Patent: *Feb. 26, 2013**

(54) DLL CIRCUIT AND CAMCORDER USING DLL CIRCUIT

(75) Inventor: Yasushi Matsuno, Kanagawa (JP)

(73) Assignee: Canon Kabushiki Kaisha, Tokyo (JP)

( * ) Notice: This patent is subject to a terminal disclaimer.

(21) Appl. No.: 12/814,680

(22) Filed: Jun. 14, 2010

Related U.S. Patent Documents

Reissue of:
(64) Patent No.: 7,019,573
Issued: Mar. 28, 2006
Appl. No.: 10/847,303
Filed: May 18, 2004

U.S. Applications:
(62) Division of application No. 12/056,927, filed on Mar. 27, 2008, now Pat. No. Re. 43,201.

(30) Foreign Application Priority Data

May 30, 2003 (JP) ..... 2003-154871
Apr. 15, 2004 (JP) ..... 2004-120342

(51) Int. Cl.
*H03L 7/00* (2006.01)
(52) U.S. Cl. ..... 327/161; 327/158
(58) Field of Classification Search ..... 327/158, 327/161
See application file for complete search history.

(56) References Cited

U.S. PATENT DOCUMENTS

| | | | | |
|---|---|---|---|---|
| 6,119,242 | A | 9/2000 | Harrison | |
| 6,239,634 | B1 | 5/2001 | McDonagh | |
| 6,259,290 | B1 | 7/2001 | Takada et al. | |
| 6,437,616 | B1 | 8/2002 | Antone et al. | |
| 6,680,634 | B1 | 1/2004 | Ruha et al. | |
| 6,844,761 | B2 | 1/2005 | Byun et al. | |
| 6,911,850 | B2 | 6/2005 | Okamura | |
| 2005/0047540 | A1 * | 3/2005 | Cho | 375/375 |

FOREIGN PATENT DOCUMENTS

JP 2004-350116 12/2004

* cited by examiner

*Primary Examiner* — Cassandra Cox
(74) *Attorney, Agent, or Firm* — Fitzpatrick, Cella, Harper & Scinto

(57) ABSTRACT

A DLL circuit which can prevent transition to a pseudo lock state is provided. The DLL circuit includes a delay stage to which a reference clock is input and in which variable delay elements D able to change an amount of delay are connected in a plurality of stages, a phase comparator (PH Comp) which compares the phase of the reference clock to the phase of one delay signal extracted from the delay stage, a delay control circuit which performs delay control of the delay element in the delay stage on the basis of the comparison result by the phase-comparison means, and a DFF which detects a phase relationship of at least two delay signals extracted from the delay stage to discriminate a state which is not a normal lock state and controls the delay control circuit to perform state transition to the normal lock state.

8 Claims, 9 Drawing Sheets

AT NORMALLY LOCK

AT PSEUDO LOCK

DLL CIRCUIT AND CAMCORDER USING DLL CIRCUIT

Matter enclosed in heavy brackets [ ] appears in the original patent but forms no part of this reissue specification; matter printed in italics indicates the additions made by reissue.

*NOTICE: More than one reissue application has been filed for the reissue of U.S. Pat. No. 7,019,573. The reissue applications are application Ser. No. 12/056,927, filed on Mar. 27, 2008, and the present application, which is a divisional application of application Ser. No. 12/056,927.*

*This application is a division of application Ser. No. 12/056,927 filed Mar. 27, 2008, U.S. Pat. No. Re. 43,201 E, which is a reissue of U.S. Pat. No. 7,019,573 B2 (which issued from application Ser. No. 10/847,303 filed May 18, 2004).*

BACKGROUND OF THE INVENTION

1. Field of the Invention

The present invention relates to a DLL (Delay-Locked Loop) circuit used for a polyphase clock generating circuit, a multiply circuit, and the like, particularly to a technique preventing a pseudo lock state which is not normally locked.

2. Related Background Art

The pseudo lock state may be one of the most serious malfunctions of the DLL circuit.

In the conventional technique, as described in U.S. Pat. No. 6,259,290, there is a method in which the pseudo lock state is detected in such a manner that a plurality of pulses are generated within the 1 period of a reference clock by the multiply circuit to count the number of pulses.

However, in the method described in U.S. Pat. No. 6,259,290, such a circuit as the multiply circuit, the counter, and the like is required, and there is a drawback which results in a cost increase and an electrical power consumption increase because the circuit is enlarged.

SUMMARY OF THE INVENTION

It is an object of the invention to provide the low-cost DLL circuit which detects the pseudo lock state with a small-scale circuit and has high accuracy and high reliability.

The DLL circuit of the invention includes a delay stage to which a reference clock is input and in which delay elements being able to change an amount of delay are connected in a plurality of stages, phase-comparison means for comparing a phase of said reference clock to the phase of one of delay signals extracted from said delay stage, controlling means for controlling the amount of delay of said delay stage on the basis of the comparison result by said phase comparing means, and state transition means for detecting a phase relationship of at least two delay signals extracted from said delay stage to discriminate a state which is not a normal lock state and for controlling said controlling means to transit the state to the normal lock state.

Since, in the normal lock state, an output signal of the delay element on a subsequent state side is always delayed in a delay relationship in the delay stage in which the plurality of variable delay elements are connected, according to the present invention, based on detection of a phase relationship between the output signals of the delay elements, it is prevented to fall into the pseudo lock state.

Depending on a type of the DLL circuit, the pseudo lock state never occurs in the case where the amount of delay is small, so that the controlling means is controlled so that the delay element becomes the minimum delay state in starting up the DLL circuit and the abnormal state can be detected in the transition state in which the normal lock state is disengaged to fall into the pseudo lock state.

DESCRIPTION OF THE PREFERRED EMBODIMENTS

Preferred embodiments of the invention will be described referring to the accompanying drawings.

(First Embodiment)

Figure 1:
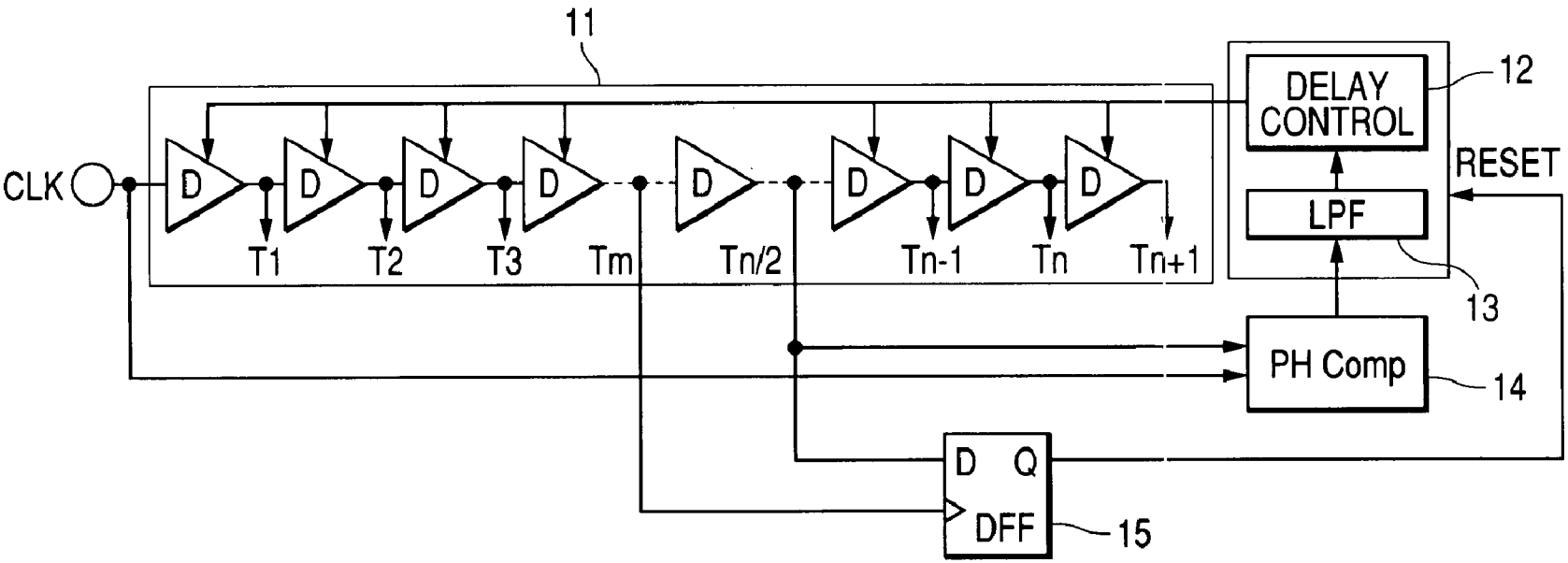
FIG. 1 is a block diagram showing a first embodiment of the DLL circuit of the invention.

FIG. 1 is a block diagram showing a first embodiment of the DLL circuit of the invention. As shown in FIG. 1, a ½ period phase-comparison type of DLL circuit includes a delay stage 11 to which a reference clock CLK is input and in which variable delay elements D are connected in a plurality of stages, a phase comparator (PH Comp) 14 which compares the phase of the reference clock CLK to the phase of intermediate delay output Tn/2 of the delay stage 11, a low-pass filter (LPF) 13 which receives an output of the phase comparator 14, and a delay control circuit 12 which performs delay control of the delay element in the delay stage 11. In the ½ period phase-comparison DLL circuit, two outputs (Tm and Tn/2) which are arbitrarily delayed are connected from inside the delay stage 11 to a rising-edge trigger type of data input flip-flop DFF 15. At this point, the output having the smaller amount of delay is connected to a clock input of DFF 15 and the output having the larger amount of delay is connected to a data input of DFF 15. The output of DFF 15 is connected to a reset terminal of LPF 13 and the delay control circuit 12. LPF 13 and the delay control circuit 12 are configured so as to minimize delay time in a reset state. In this case, the flip-flop DFF 15 has a function of detecting the pseudo lock state and of preventing the transition to the pseudo lock state.

Figure 2:
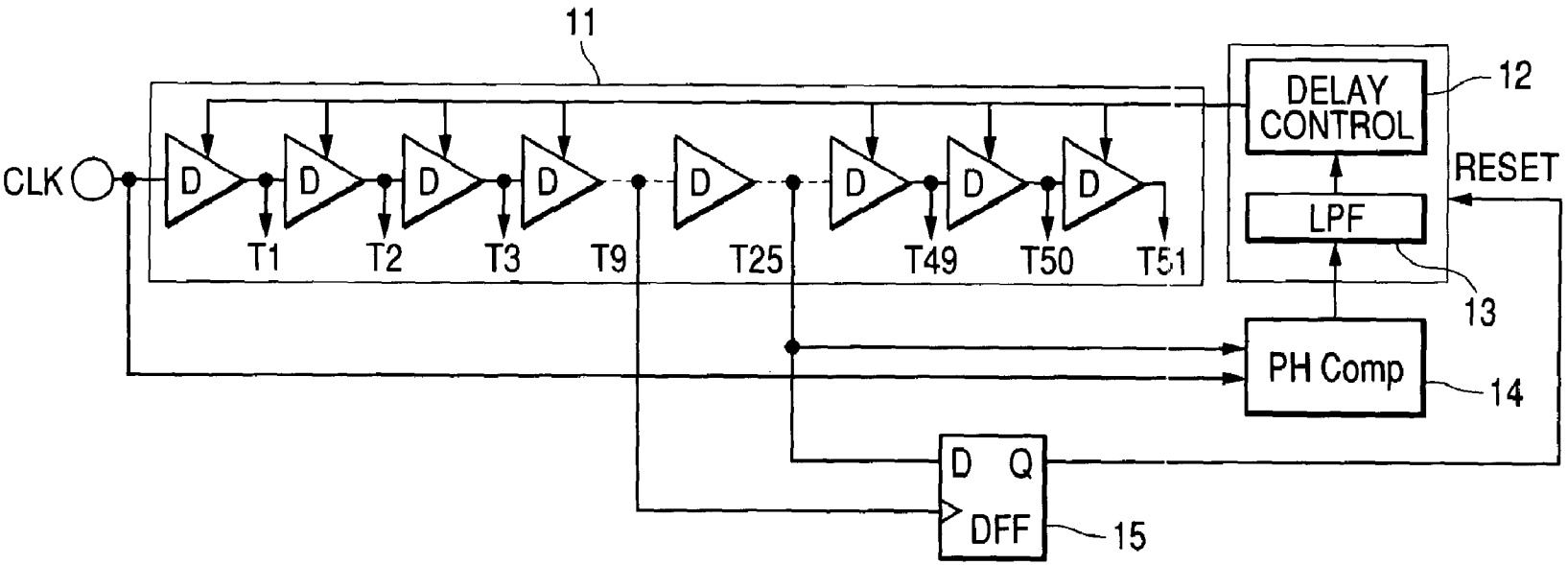
FIG. 2 is a block diagram of an example more specifically showing the first embodiment.

FIG. 2 is the block diagram of an example more specifically showing the above embodiment. In FIG. 2, the same components as FIG. 1 are indicated by the same reference numerals and signs.

In FIG. 2, the ½ period phase-comparison type of DLL circuit includes the delay stage 11 in which variable delay elements D are connected in 50 stages, the phase comparator (PH Comp) 14 which compares the phase of the reference clock to the phase of the delay output in the 25th stage, the low-pass filter (LPF) 13 which receives the output of the phase comparator 14, and the delay control circuit 12 which performs the delay control of the delay element D. In the ½ period phase-comparison type of DLL circuit, two outputs arbitrarily delayed are connected from inside the delay stage 11 to the rising-edge trigger type of data input flip-flop DFF 15. At this point, the delay output having the smaller amount of delay of the 9th stage is connected to the clock input of DFF 15 and the delay output having the larger amount of delay of the 25th stage is connected to the data input of DFF 15. The output of DFF 15 is connected to the reset terminal of LPF 13 and the delay control circuit 12. LPF 13 and the delay control circuit 12 are configured so as to minimize the delay time in the reset state.

Figure 3:
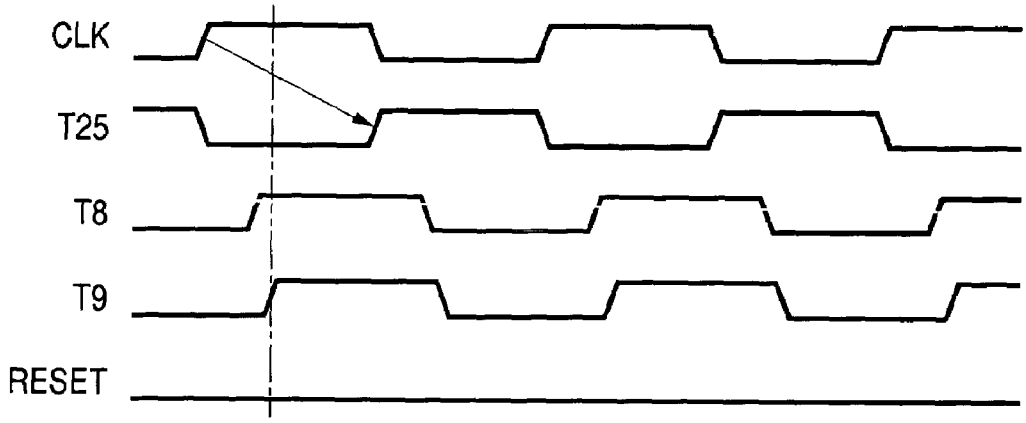
FIG. 3 is a timing chart of a normal lock state in a ½ period phase-comparison DLL circuit.

FIG. 3 shows each output wave in the normal state. In the normal state, a rising position of the delay output T25 in the 25th stage is controlled at the position of the ½ period of the reference clock CLK, and the rising positions of the delay output T8 in the 8th stage and the delay output T9 in the 9th stage are located between the rising edge of the reference clock CLK and the rising position of the delay output in the 25th stage. At this point, a RESET signal which is of the output of DFF 15 becomes Low-level output.

Figure 4:
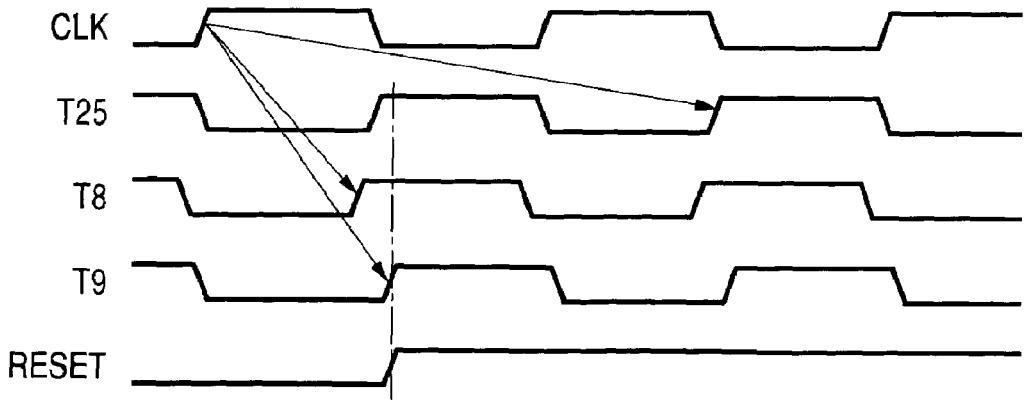
FIG. 4 is a timing chart of a 1.5-period pseudo lock state in the ½ period phase-comparison DLL circuit.

FIG. 4 shows the pseudo lock state. In FIG. 4, the pseudo lock state occurs at the ½ period+the 1 period. Although the delay output in the 25th stage can be seen as close as the normal lock state, actually the reference clock CLK is not the delay of the ½ period but the reference clock CLK is the delay of the one and half periods. Thus, in the DLL circuit of the embodiment, there is the state in which the lock occurs at the amount of delay in which the period of integer multiples is added to the phase comparison position. However, in the case of the small amount of delay, there is no pseudo lock in the circuit configuration. The state shown in FIG. 4 is an example in which the lock occurs at the 1.5 periods, the rising position of the delay output T8 in the 8th stage is located at the back of the rising position of the delay output T25, and the rising position of the delay output T9 in the 9th stage is located in front of the rising position of the delay output T25. In the normal lock state, the rising position of delay output T25 cannot exist between the rising positions of the reference clock CLK and the delay output T9. The DFF circuit 15 detects the state in which the rising position of delay output T25 exists between the rising positions of the reference clock CLK and the delay output T9 as the pseudo lock state, the RESET signal which is the output of the DFF becomes a High level output, and the DFF circuit can cause the DLL circuit to transit to the normal lock state by resetting the delay control circuit.

Figure 5:
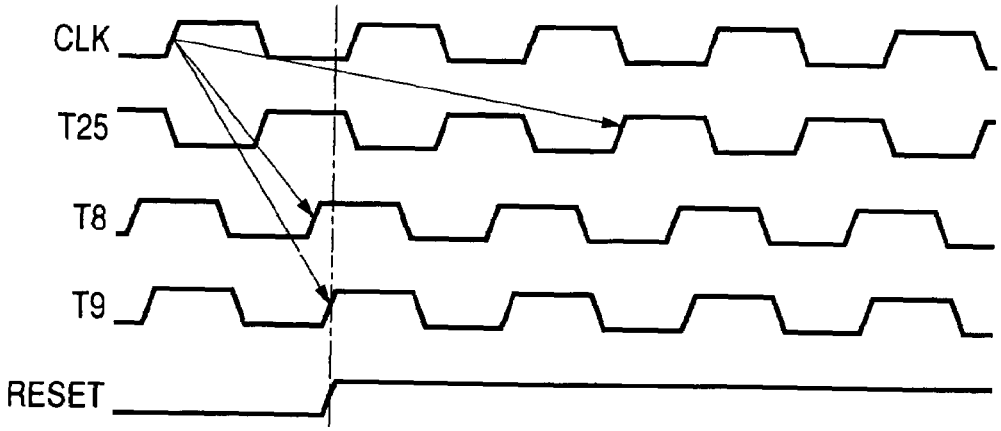
FIG. 5 is a timing chart of a 2.5-period pseudo lock state in the ½ period phase-comparison DLL circuit.

FIG. 5 shows the pseudo lock state in which the 1 period is further added to the pseudo lock state shown in FIG. 4. In the pseudo lock state of FIG. 5, both the rising positions of the delay output T8 in the 8th stage and the delay output T9 in the 9th stage are located at the back of the rising position of the delay output T25. When duty of the reference clock and the duty of each of the delay outputs are in the ideal state, the DFF circuit can detect the state shown in FIG. 5 as the pseudo lock state.

Figure 6:
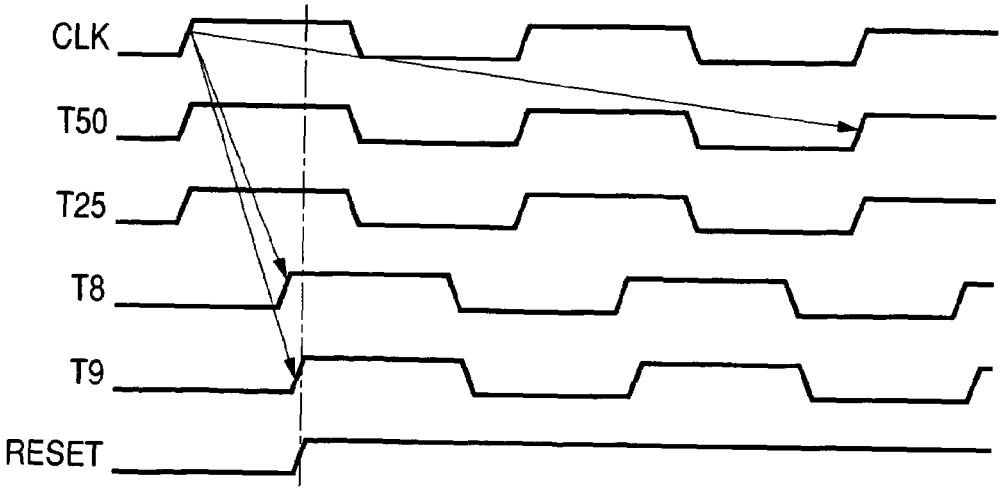
FIG. 6 is a timing chart of a 2-period pseudo lock state in a 1 period phase-comparison DLL circuit.

A +1 period pseudo lock state of a 1 period phase-comparison type DLL circuit will be described referring to FIG. 6 (the circuit diagram is not shown). The 1 period phase-comparison type DLL circuit compares the phase of the reference clock CLK to the phase of the delay output in the 50th stage. Therefore, in *the* state in which the pseudo lock occurs at the +1 period, the delay output T25 in the 25th stage becomes equal to the delay output T50 in the 50th stage. At this point, since the rising positions of the delay output T8 in the 8th stage and the delay output T9 in the 9th stage are located at the back of the rising position of the delay output T25, the DFF circuit can detect the state shown in FIG. 6 as the pseudo lock state.

(Second Embodiment)

Figure 7:
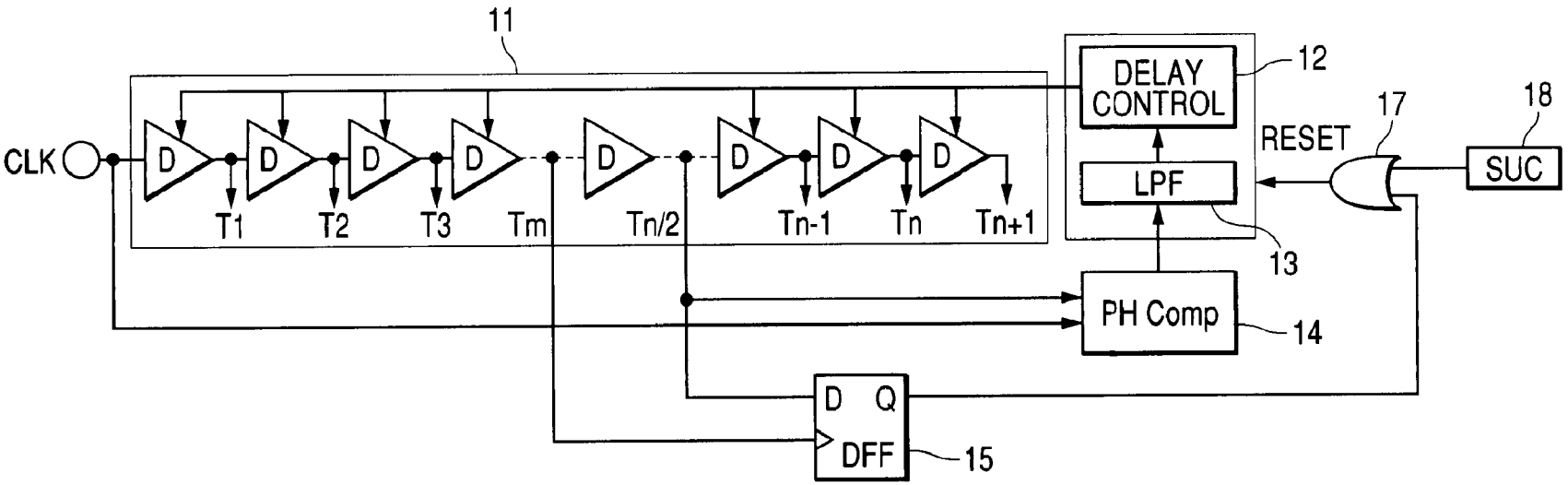
FIG. 7 is a block diagram showing a second embodiment of the DLL circuit of the invention.

FIG. 7 is the block diagram showing a second embodiment of the DLL circuit of the invention. The ½ phase-comparison type of DLL circuit includes the delay stage 11 in which the variable delay elements D are connected in n stages, the phase comparator (PH Comp) 14 which compares the phase of the reference clock CLK to the phase of the delay output in the n/2-th stage, the low-pass filter (LPF) 13 which receives the output of the phase comparator 14, and the delay control circuit 12 which performs the delay control of the delay element D. In the ½ period phase-comparison DLL circuit, two outputs arbitrarily delayed are connected from inside the delay stage 11 to the rising-edge trigger type of data input flip-flop DFF 15. At this point, the output having the smaller amount of delay is connected to the clock input of DFF 15 and the output having the larger amount of delay is connected to the data input of DFF 15. The output of DFF 15 is connected to one of inputs of a logic OR gate 17, and the other input of the logic OR gate 17 is connected to the output of a startup clear circuit (SUC) 18. The output of the logic OR gate 17 is connected to the RESET terminal of LPF 13 and the delay control circuit 12 as the RESET signal. LPF 13 and the delay control circuit 12 are configured so as to minimize the delay time in the reset state.

The startup clear circuit (SUC) 18 is one which detects the state, such as power-up or a power saving mode of the DLL circuit, in which circuit operation transits from an OFF state to an ON state, and this operation allows the variable delay element D to be set to the minimum delay state in starting the DLL circuit.

Accordingly, in the DLL circuit of the embodiment, since a delay control loop is operated from the minimum state of the delay, it is difficult to transit to the pseudo lock state having the large delay. However, even in the case where the normal lock state is disengaged, the pseudo lock state can be detected by detecting the phase relationship within the delay stage with DFF.

Similarly to the example of the first embodiment shown in FIG. 2, an example of the embodiment is also the ½ period phase-comparison type of DLL circuit including the delay stage 11 in which the variable delay elements D are connected in 50 stages, the phase comparator (PH Comp) 14 which compares the phase of the reference clock to the phase of the delay output in the 25th stage, the low-pass filter (LPF) 13 which receives the output of the phase comparator 14, and the delay control circuit 12 which performs the delay control of the delay element D. In the ½ period phase-comparison DLL circuit, the two outputs arbitrarily delayed are connected from inside the delay stage 11 to the rising-edge trigger type of data input flip-flop DFF 15. At this point, the delay output having the smaller amount of delay of the 9th stage is connected to the clock input of DFF 15 and the delay output having the larger amount of delay of the 25th stage is connected to the data input of DFF 15.

In the above-described pseudo lock state, the delay stage formed by the 50-stage delay element was described as the example. However, in the actual operation, since a reverse state of the phase relationship is certainly generated in the delay stage until the normal lock state transits to the pseudo lock state, the optimum two points in the delay stage may be selected by the number of delay stages and loop gain.

Figure 12A:
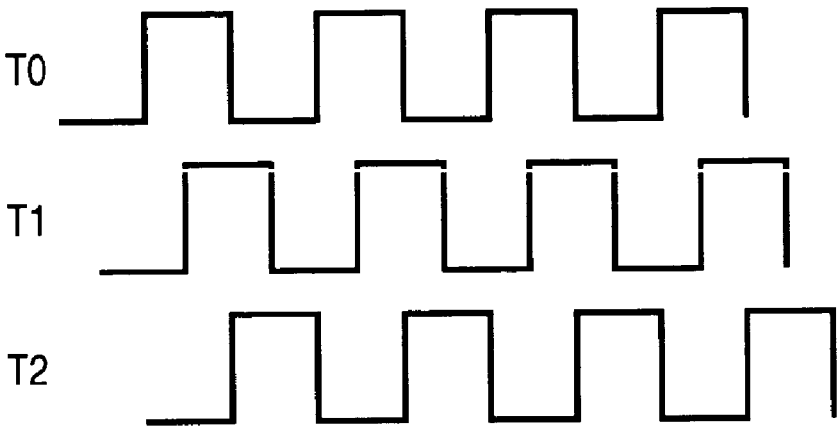
FIG. 12A is a timing chart showing the normal lock state and FIG. 12B is a timing chart showing the pseudo lock state, in the case where a delay stage is formed by a four-stage delay element.
Figure 12B:
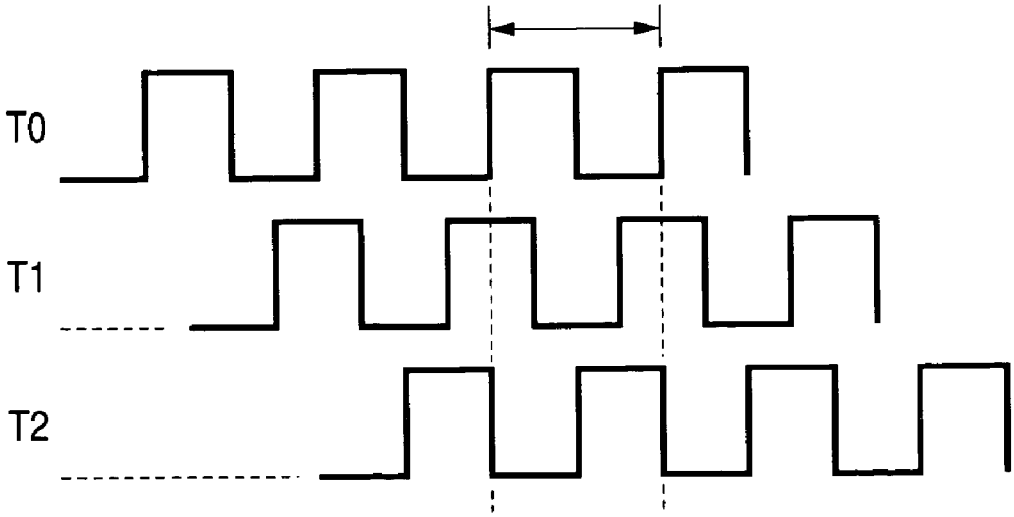

The reversal of the phase relationship of the delay signal can be also generated between the delay signals of the delay elements adjacent to each other. For example, in the case where the delay stage is formed by the 4-stage delay element, the phase relationship is reversed within the 1 period between delay signals T1 and T2 output from the delay elements adjacent to each other as shown in FIGS. 12A and 12B. Although the delay stage formed by the small number of stages of the delay element was cited as an example, the reversal of the phase relationship can be also generated in the delay stage formed by the large number of stages of the delay element. Therefore, sometimes the phase relationship between the output signals of the delay elements adjacent to each other is detected. FIG. 12A shows the timing chart of the normal lock state and FIG. 12B shows the timing chart of the pseudo lock state.

Further, in the above embodiments, although the reversal of the phase relationship is decided by the relationship between the outputs of the 25th stage and the 9th stage, the reversal of the phase relationship can be also decided by the relationship between the outputs of the 25th stage and the stage after the 9th stage.

Therefore, even if the reference clock CLK input to the DLL circuit or the duty of the variable delay element D is not in the ideal state, the transition to the pseudo lock state can be prevented. The control is not limited to the startup clear circuit, and the circuit having the same effect as the startup clear circuit may be used.

(Third Embodiment)

Figure 8:
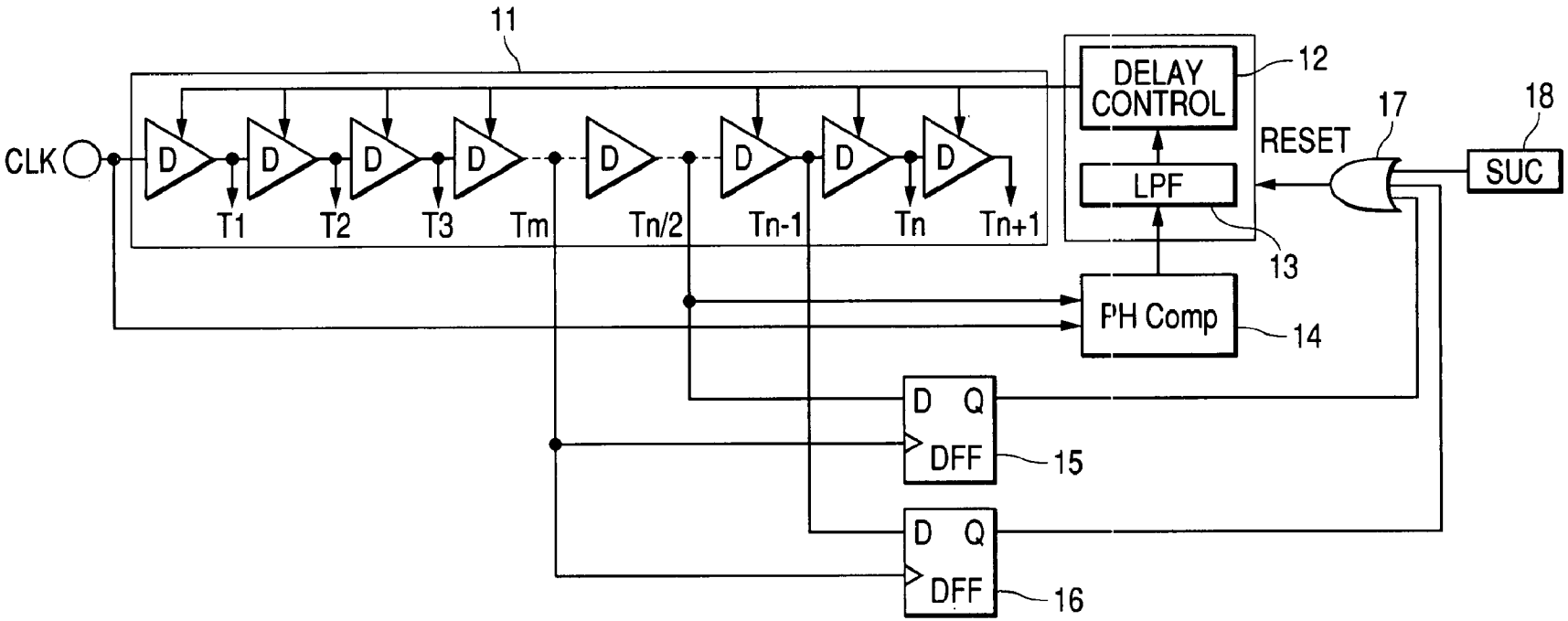
FIG. 8 is a block diagram showing a third embodiment of the DLL circuit of the invention.

FIG. 8 is the block diagram showing a third embodiment of the DLL circuit of the invention. In FIG. 8, the same components as FIG. 7 are indicated by the same reference numerals and signs. The third embodiment is one in which DFF 16 is provided in addition to DFF 15 in the configuration of the second embodiment. It will be also appreciated that DFF 16 may be provided in the configuration of the first embodiment shown in FIG. 1.

Thus, it will be appreciated that at least one more pseudo lock detection circuit may be provided in order to improve a detection rate.

An example of an indicator concerning selection of the delay output used for the detection of the pseudo lock will be described below.

As described above, in the DLL circuit, the pseudo lock state for the desired period exists in +1 period unit. When the unlock state is in the +½ period state compared to the normal lock state, it is not clear whether the unlocked state transits to the normal lock state or to the pseudo lock state. Therefore, for the delay output for detecting the pseudo lock state, in the ½ period phase-comparison type, when the amount of delay becomes larger than the ½ period, i.e., double the desired amount of delay, the two outputs of the delay stage in which the phase relationship is reversed are selected. For example, in the case where the delay stage is formed in 50 stages, the selection of the two delay outputs before the 50/2 step is preferable for the detection on the pseudo lock side.

Further, in the state in which the amount of delay triples the desired amount of delay, the outputs in which the delay relationship is reversed are selected so that the pseudo lock is securely detected in +1 period. In the delay output of the subsequent[.] stage, because the absolute change in the amount of delay is larger, the output stage having the amount of delay which does not exceed the 1 period of the reference clock even in the +1 period pseudo lock is used as a guide in one of the outputs of the delay stage. If feasible, in the +2 period pseudo lock, the amount of delay may be also within the 1 period of the reference clock. For example, in the case of the DLL circuit having the 50 stages, the output before the 50/2 stage is used for one of the delay outputs and the output before the 50/3 stage is used for the other delay output, or the output before the 50/5 stage is used for the other delay output in order to satisfy the secure detection in the +2 period pseudo lock. In the case of the 1 period phase-comparison type, the output before the 50/1.5 stage is used for one of the delay outputs in order not to securely decide the pseudo lock state before the 1.5 periods, and the amount of delay becomes larger than double the desired amount of delay, i.e., the output before the 50/2 stage may be selected for the other delay output in order to detect the +1 period pseudo lock, or the output before the 50/3 stage may be selected for the other delay output in order to detect the +2 period pseudo lock.

In the examples of the 50-stage DLL circuit shown in the first and second embodiments, the outputs of the 25th stage and the 9th stage are used as the delay output and the delay signal completely satisfying the above-described conditions is used.

Figure 9:
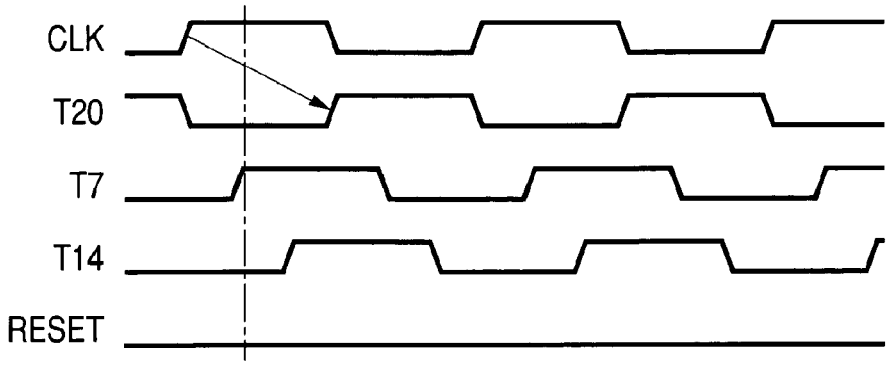
FIG. 9 is a timing chart of the normal lock state in the ½ period phase-comparison DLL circuit (40-stage configuration)
Figure 10:
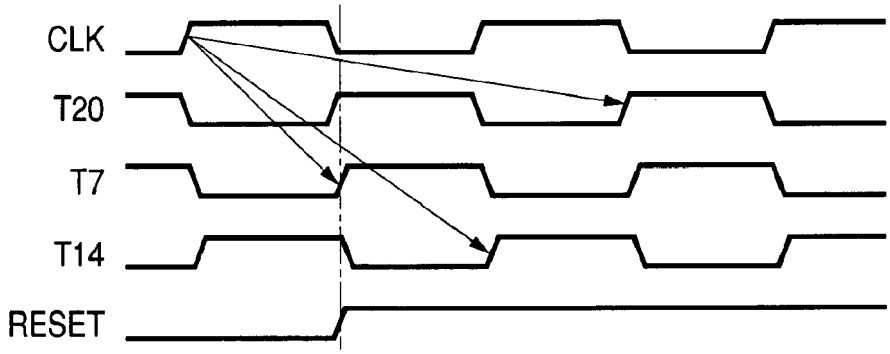
FIG. 10 is a timing chart of the 1.5-period pseudo lock state in the ½ period phase-comparison DLL circuit (40-stage configuration)
Figure 11:
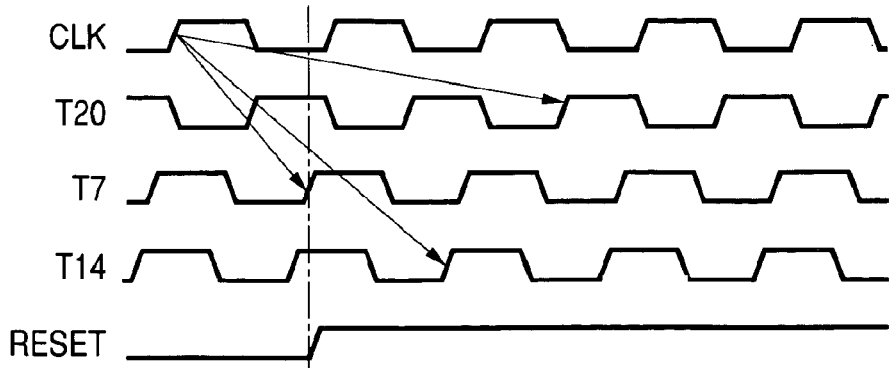
FIG. 11 is a timing chart of the 2.5-period pseudo lock state in the ½ period phase-comparison DLL circuit (40-stage configuration)

In the case where the detection is performed on the basis of the above conditions in the ½ period phase-comparison DLL circuit having 40-stage configuration, FIG. 9 shows the timing chart during the normal lock state, FIG. 10 shows the timing chart of the +1 period pseudo lock state, and FIG. 11 shows the timing chart of the +2 period pseudo lock state. In this case it is possible to satisfy the above conditions by using the delay output of the 7th stage and the delay output of the 14th stage or the delay output of the 20th stage.

Even if these conditions are completely satisfied, since the delay relationship is always reversed in the process of the transition to the pseudo lock, the detection can be performed by selecting the delay outputs on the assumption that the amount of delay becomes larger than the ½ period to the desired amount of delay. Alternatively, the plurality of detection circuits such as the combination detecting the +1 period pseudo lock state, the combination detecting the +2 period pseudo lock state, and the combination detecting the +3 period pseudo lock state can be provided to improve the detection rate.

Although the output of the delay element input to the data input terminal of the DFF corresponds to the output of the delay element input to the phase comparator in the above embodiment, it is not always necessary that the output of the delay element input to the data input terminal of the DFF corresponds to the output of the delay element input to the phase comparator, and it will be appreciated that the output of the delay element input to the data input terminal of the DFF and the output of the delay element input to the phase comparator are output from the individual variable delay element.

As described above, in the second and third embodiments, the transition to the pseudo lock can be prevented in such a manner that the flip-flop circuit DFF and the startup clear circuit SUC are added to the DLL basic circuit, the delay is started from the minimum state, and the [before-and after]

*before-and-after* phase relationship in the delay stage is detected. When the power saving mode signal exists, the power saving can be achieved only by the flip-flop circuit with setting function, so that *a* low-cost, high-reliability DLL circuit can be provided. Further, in the first to third embodiments, since it is not necessary to change the delay stage and the input reference clock, excessive delay is never generated and the DLL circuit can be implemented with high accuracy.

(Fourth Embodiment)

One example of the cases in which the DLL circuit of the invention is applied to a camcorder will be described in detail below referring to FIG. 13.

Figure 13:
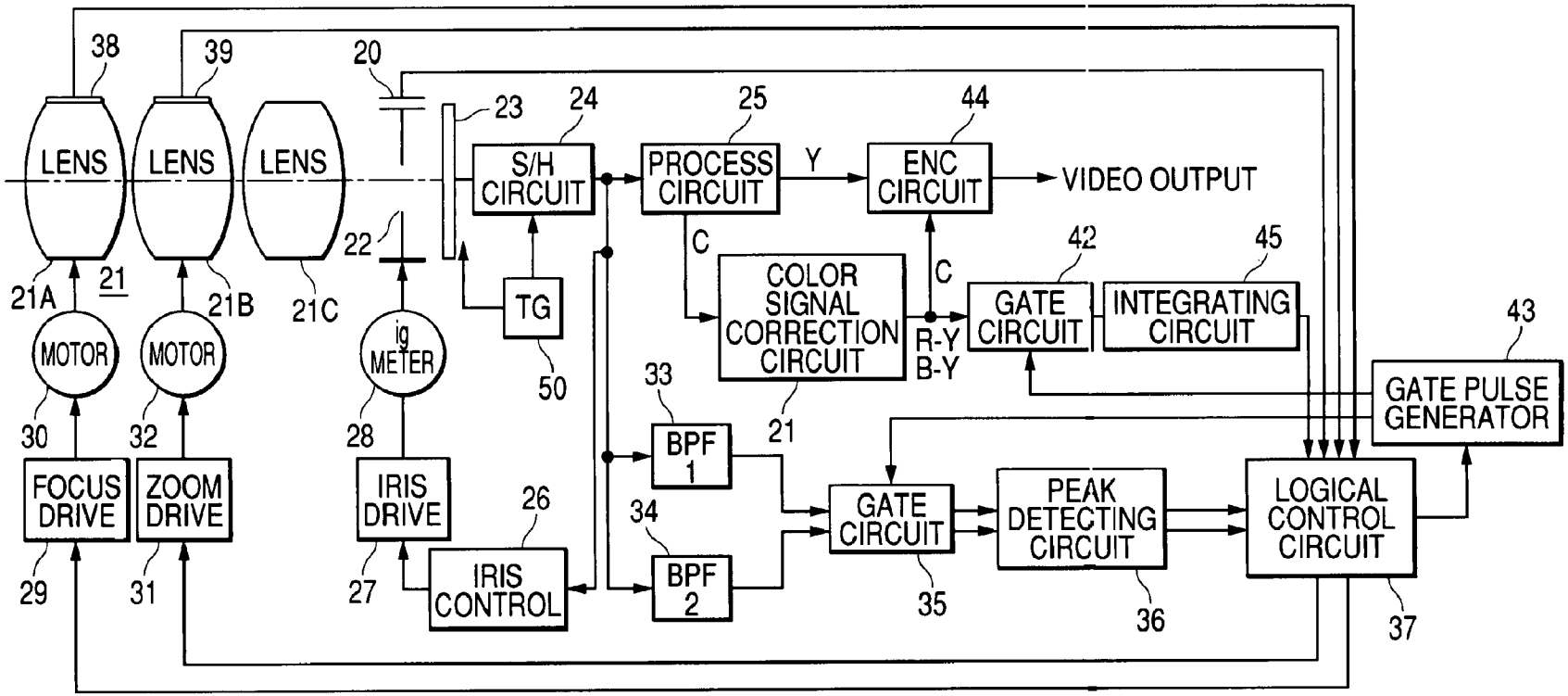
FIG. 13 is a block diagram showing a fourth embodiment in which the DLL circuit of the invention is applied to a camcorder.

FIG. 13 is the block diagram showing the case in which the DLL circuit of the invention is applied to the camcorder. The lens designated by the numeral 21 includes a focus lens 21A which adjusts a focus with a taking lens, a zoom lens 21B which performs a zoom operation, and an imaging lens 21C.

The numeral 22 designates an iris, the numeral 23 designates a solid-state image sensing device which photoelectrically converts a subject image imaged on an imaging area into an electric imaging signal, and the numeral 24 designates a sample hold circuit (S/H circuit). The S/H circuit 24 performs sample hold of the imaging signal output from the solid-state image sensing device, amplifies the level of the imaging signal, and outputs a video signal.

The numeral 25 designates a process circuit which performs predetermined processing such as gamma correction, color separation, and blanking to the video signal output from the sample hold circuit 24 and outputs a luminance signal Y and a chroma signal C. In a color signal correction circuit 31, the corrections of white balance and color balance are performed to the chroma signal C output from the process circuit 25, and the chroma signal C after the corrections is output as color difference signals R-Y and B-Y. The luminance signal Y output from the process circuit 25 and the color difference signals R-Y and B-Y output from the color signal correction circuit 31 are modulated by an encoder circuit (ENC circuit) 34 and output as a standard television signal. Then, the standard television signal is supplied to a video recorder (not shown) or a monitor EVF such as an electronic view finder (not shown).

The numeral 26 designates an iris control circuit which controls an iris drive circuit 27 on the basis of the video signal supplied from the S/H circuit 24 and automatically controls an ig meter in order to control a numerical aperture of the iris 22 so that the level of the video signal becomes a predetermined value having a certain level. The numerals 33 and 34 designate a band-pass filter (BPF) which extracts a high-frequency component required to detect a focal point in the video signal output from the sample hold circuit 24, and the band-pass filters 33 and 34 restrict a different band. The signals output from the first band-pass filter (BPF1) 33 and the second band-pass filter (BPF2) 34 are gated by a focus gate frame signal in a gate circuit 35, respectively, peak values of the signals are detected and held by a peak detecting circuit 36, and the signals are input to a logical control circuit 37.

The signals are referred to as focal voltage, and the focusing is performed by the focal voltage.

The numeral 38 designates a focus encoder which detects a moved position of the focus lens 21A, the numeral 39 designates a zoom encoder which detects a focal distance of the zoom lens 21B, and the numeral 40 designates an iris encoder which detects the numerical aperture of the iris 22. The detection values of these encoders are supplied to the logical control circuit 37.

The logical control circuit 37 detects and adjusts the focal point to the subject on the basis of the video signal corresponding to an area set to detection of the focal point. Namely, the logical control circuit 37 takes in information on the peak values of the high-frequency components supplied from the band-pass filters 33 and 34, and supplies control signals such as a rotational direction, rotational speed, rotation and stop of a focus motor 30 to the focus drive circuit 29 and controls the control signals in order to drive the focus lens 21A to the position where the peak value of the high-frequency component becomes the maximum.

The DLL circuit of the invention is provided in a timing generator (TG) 50 and used so as to drive the photoelectric conversion device 23 and to finely adjust drive timing of the S/H circuit 24 and the like.

As described above, according to the invention, the transition to the pseudo lock can be prevented. Further, since the delay can be started from the minimum state by providing the means for controlling the amount of delay so as to minimize the amount of delay during the startup of the DLL circuit in power-up and the power saving mode, the transition to the pseudo lock state becomes more difficult.

What is claimed is:

[1. A DLL circuit comprising:

a delay stage to which a reference clock is input and in which delay elements able to change an amount of delay are connected in a plurality of stages;

phase-comparison means for comparing a phase of the reference clock to the phase of one of delay signals extracted from said delay stage;

controlling means for controlling the amount of delay of said delay stage on the basis of the comparison result by said phase-comparison means;

state transition means for detecting a phase relationship of at least two delay signals extracted from said delay stage to discriminate a state which is not a normal lock state and for controlling said controlling means to transit the state to the normal lock state; and means for controlling said controlling means so as to minimize the amount of delay in starting up the DLL circuit.]

[2. A DLL circuit according to claim 1, wherein reversal of a delay relationship of the phase of one of the delay signals to the phase of another delay signal is detected in detection of a phase relationship of said state transition means.]

[3. A DLL circuit according to claim 1, wherein said state transition means is an edge trigger type of data input flip-flop circuit, a delay signal of a previous stage having a smaller amount of delay extracted from said delay stage is connected to a clock input of said flip-flop circuit, and the delay signal of a subsequent stage having a larger amount of delay is connected to a data input of said flip-flop circuit.]

[4. A camcorder having a DLL circuit according to claim 1.]

[5. A DLL circuit comprising:

a delay stage to which a reference clock is input and in which delay elements able to change an amount of delay are connected in a plurality of stages;

phase-comparison means for comparing a phase of the reference clock to the phase of one of delay signals extracted from said delay stage;

controlling means for controlling the amount of delay of said delay stage on the basis of the comparison result by said phase-comparison means; and state transition means for controlling said controlling means so that the amount of delay of said delay stage is minimized in starting up the DLL circuit, for detecting a phase relationship of at least two delay signals extracted from said delay stage to discriminate a state which is not a normal lock state except the start-up of the DLL circuit and for controlling said controlling means to transit the state to the normal lock state.]

[6. A DLL circuit comprising:

a delay stage to which a reference clock is input and in which delay elements able to change an amount of delay are connected in a plurality of stages;

phase-comparison means for comparing a phase of the reference clock to the phase of one of delay signals extracted from said delay stage;

controlling means for controlling the amount of delay of said delay stage on the basis of the comparison result by said phase-comparison means; and a plurality of state transition means for detecting a phase relationship of at least two delay signals extracted from said delay stage to discriminate a state which is not a normal lock state and for controlling said controlling means to transit the state to the normal lock state.]

*7. A camera comprising a DLL circuit, the DLL circuit comprising:*

*a delay stage inputting a reference clock, and comprising a plurality of delay elements connected to form a plurality of stages, wherein a delay time of each delay element is controllable;*

*phase-comparison means for comparing phases of clocks selected from among the reference clock and delayed clocks outputted from the delay elements;*

*first controlling means for controlling the delay time of the delay stage on the basis of the comparison result by the phase-comparison means;*

*state transition means for detecting a phase relationship of clocks to determine as to whether or not a state of the DLL circuit is a normal lock state;*

*second controlling means for controlling said first controlling means so as to minimize the delay time in starting up the DLL circuit.*

*8. A camera according to claim 7, wherein said state transition means detects, as the phase relationship, a reversal of a delay relationship of the phase of one of the clocks to the phase of another of the clocks.*

*9. A camera according to claim 7, wherein said state transition means comprises an edge trigger type data input flip-flop circuit, inputs from a clock input of the flip-flop circuit a delay signal of a smaller delay amount from a former stage, and inputs from a data input of the flip-flop circuit a delay signal of a larger delay amount from a latter stage.*

*10. A camera according to claim 7, wherein a plurality of said state transition means are provided in the DLL circuit.*

*11. A DLL circuit comprising:*

*a delay stage inputting a reference clock, and comprising a plurality of delay elements connected in a plurality of stages which output delay clocks, wherein a delay time of each delay element is controllable;*

*phase-comparison means for comparing phases of clocks selected from among the reference clock and delay clocks outputted from the delay elements;*

*control means for controlling the delay time of said delay stage on the basis of the comparison result by said phase-comparison means; and*

*state transition means for detecting a phase relationship of delay clocks to determine whether or not a state of the DLL circuit is in a normal lock state, wherein*

*said control means is reset in either case of when said state transition means determines that the DLL circuit is not in the normal lock state or when starting up the DLL circuit,*

*the delay time of said delay stage is minimized through the resetting of the control means, and*

*said state transition means detects, as the phase relationship, a reversal of a delay relationship of the phase of one of the delay clocks to the phase of another of the delay clocks.*

*12. A DLL circuit according to claim 11, wherein said state transition means comprises an edge trigger type data input flip-flop circuit, inputs from a clock input of the flip-flop circuit a delay clock from a first stage in said delay stage, and inputs from a data input of the flip-flop circuit a delay clock from a second stage positioned downstream of the first stage in said delay stage.*

*13. A DLL circuit according to claim 11, wherein a plurality of said state transition means are provided.*

*14. A camera comprising a DLL circuit according to claim 11.*

* * * * *